(12) United States Patent
Adiga

(10) Patent No.: US 11,947,270 B2
(45) Date of Patent: Apr. 2, 2024

(54) METROLOGY OF SEMICONDUCTOR DEVICES IN ELECTRON MICROGRAPHS USING FAST MARCHING LEVEL SETS

(71) Applicant: FEI Company, Hillsboro, OR (US)

(72) Inventor: Umesh Adiga, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 533 days.

(21) Appl. No.: 17/176,801

(22) Filed: Feb. 16, 2021

(65) Prior Publication Data

US 2021/0263430 A1 Aug. 26, 2021

Related U.S. Application Data

(60) Provisional application No. 62/982,039, filed on Feb. 26, 2020.

(51) Int. Cl.
*G03F 7/20* (2006.01)
*G03F 7/00* (2006.01)
(Continued)

(52) U.S. Cl.
CPC ...... *G03F 7/70666* (2013.01); *G03F 7/70091* (2013.01); *G06N 3/04* (2013.01); *G06N 7/01* (2023.01); *G06N 20/00* (2019.01); *G06T 7/0004* (2013.01); *G06T 7/11* (2017.01); *G06T 7/12* (2017.01); *G06T 2207/10061* (2013.01); *G06T 2207/20081* (2013.01); *G06T 2207/30148* (2013.01)

(58) Field of Classification Search
CPC ............ G06N 7/01; G06N 3/04; G06N 20/00; G06N 20/10; G06N 20/20; G06N 3/08; G06N 5/01; G06T 7/0004; G06T 7/12; G06T 7/149; G06T 7/11; G06T 2207/30148; G06T 2207/20084; G06T 2207/10056; G06T 2207/20081; G06T 2207/10061; G03F 7/70666; G03F 7/70091

See application file for complete search history.

(56) References Cited

U.S. PATENT DOCUMENTS

2005/0100220 A1* 5/2005 Keaton ..................... G06T 7/11
382/191
2006/0153435 A1* 7/2006 Wallmark ................. G06T 7/64
382/129

(Continued)

OTHER PUBLICATIONS

Igor Ravve and Ravi Malladi, Fast Difference Schemes for Edge Enhancing Beltrami Flow, Conference Paper in Lecture Notes in Computer Science, Conference: Proceedings of the 7th European Conference on Computer Vision—Part I, Apr. 2002,.

(Continued)

*Primary Examiner* — Sang H Nguyen
(74) *Attorney, Agent, or Firm* — Michael Best & Friedrich LLP

(57) ABSTRACT

Apparatuses and methods for metrology on devices using fast marching level sets are disclosed herein. An example method at least includes initiating a fast marching level set seed on an image, propagating a fast marching level set curve from the fast marching level set seed to locate boundaries of a plurality of regions of interest within the image, and performing metrology on the regions of interest based in part on the boundaries.

26 Claims, 8 Drawing Sheets

(51) Int. Cl.
  *G06N 3/04*   (2023.01)
  *G06N 7/00*   (2023.01)
  *G06N 7/01*   (2023.01)
  *G06N 20/00*  (2019.01)
  *G06T 7/00*   (2017.01)
  *G06T 7/11*   (2017.01)
  *G06T 7/12*   (2017.01)

(56) References Cited

U.S. PATENT DOCUMENTS

| | | | | |
|---|---|---|---|---|
| 2007/0058865 | A1* | 3/2007 | Li | G06T 7/12 |
| | | | | 382/173 |
| 2007/0109874 | A1* | 5/2007 | Padfield | G06T 7/149 |
| | | | | 365/189.04 |
| 2008/0030497 | A1* | 2/2008 | Hu | G06V 10/267 |
| | | | | 345/419 |
| 2009/0041315 | A1* | 2/2009 | Fahmi | G06T 7/149 |
| | | | | 382/128 |
| 2012/0157822 | A1* | 6/2012 | van Dam | A61B 5/318 |
| | | | | 600/513 |
| 2014/0064596 | A1* | 3/2014 | He | G06V 10/44 |
| | | | | 382/141 |
| 2014/0258941 | A1* | 9/2014 | Lim | G06T 7/13 |
| | | | | 715/862 |
| 2015/0063668 | A1* | 3/2015 | You | G06T 7/11 |
| | | | | 382/131 |
| 2018/0000441 | A1* | 1/2018 | Wang | G06V 10/755 |
| 2019/0392578 | A1* | 12/2019 | Chukka | G06V 20/698 |

OTHER PUBLICATIONS

Yunjin Chen and Thomas Pock, Trainable Nonlinear Reaction Diffusion: A Flexible Framework for Fast and Effective Image Restoration, IEEE Transactions on Pattern Analysis and Machine Intelligence, vol. XX, No. XX, 2016,.

J. A. Sethian, Evolution, Implementation, and Application of Level Set and Fast Marching Methods for Advancing Fronts, Journal of Computational Physics 169, 503-555 (2001).

Mikkel B. Stegmann, Fast Marching Level Sets, Theory & Applications, Advanced Image Analysis, IMM Apr. 4, 2001.

Jonathan Hearn, Competitive Medical Image Segmentation With the Fast Marching Method, Thesis, Department of Electrical Engineering and Computer Science, Case Western Reserve University, May 2008.

Stuart P. Lloyd, Least Squares Quantization in PCM, IEEET Ransactionso N Information Theory,vol. IT-28, No. 2, Mar. 1982.

David Bryant Mumford, Jayant Shah, 1989, Optimal approximations by piecewise smooth functions and associated variational problems, Communications on Pure and Applied Mathematics 42(5): 577-685.

Michael T. Snella, Drift Correction for Scanning-Electron Microscopy Submitted to the Department of Electrical Engineering and Computer Science Thesis Massachusetts Institute of Technology, Sep. 2010.

Umesh Adiga, Michael Strauss, Ashley Tilson, Jason Arjavac, Jack Hagger, Justin Roller, Dan Nelson, Metrology of 3D Nand in Electron Micrographs by Scale Space Snakes, Proc. SPIE 10959, Metrology, Inspection, and Process Control for Microlithography XXXIII, 1095924 (Mar. 26, 2019).

Micah Ledoux, James Clarke, Brett Avedisian, Chad Rue, Umesh Adiga, Mark Biedrzycki, Gas-enhanced PFIB surface preparation enabled metrology and statistical analysis of 3D NAND devices, Proc. SPIE 10959, Metrology, Inspection, and Process Control for Microlithography XXXIII, 1095901 (Mar. 26, 2019).

Umesh Adiga, Derek Higgins, Sang Hoon Lee, Mark Biedrzycki, Dan Nelson, Metrology of 3D-NAND Structures using Machine Learning Assisted Fast Marching Level-Sets Algorithm, Proceedings SPIE vol. 11325, Metrology, Inspection, and Process Control for Microlithography XXXIV; 1132530 (Mar. 20, 2020).

* cited by examiner

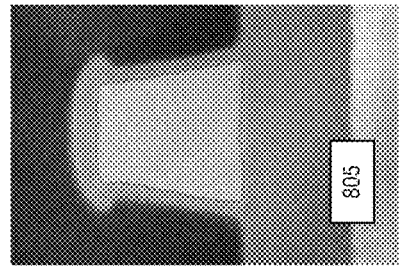
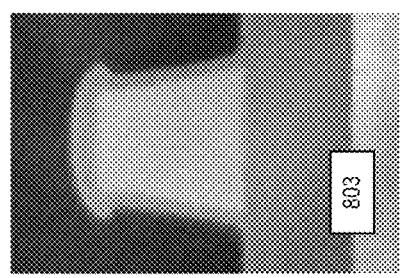
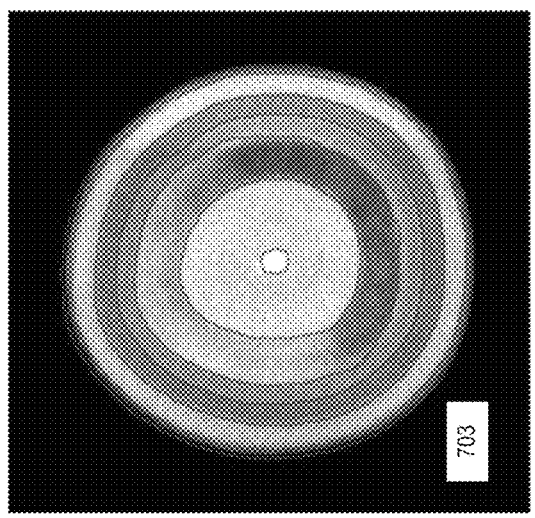
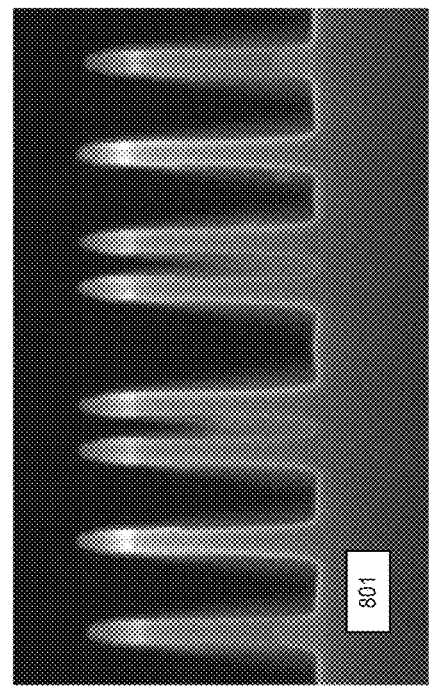
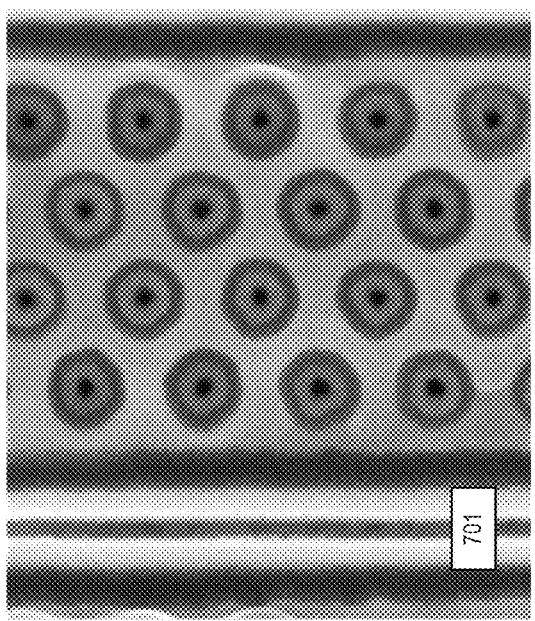
Fig. 7
Fig. 8

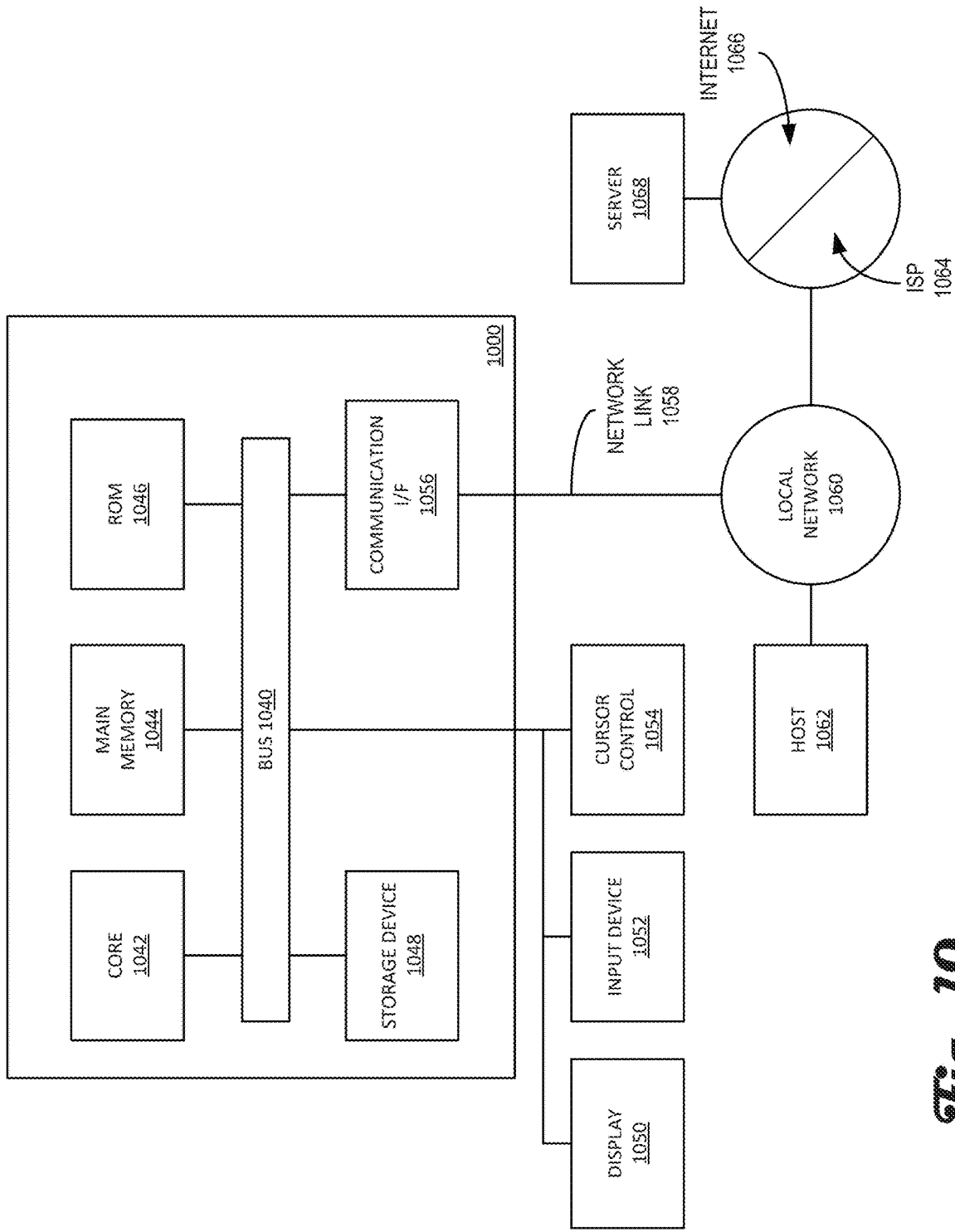

METROLOGY OF SEMICONDUCTOR DEVICES IN ELECTRON MICROGRAPHS USING FAST MARCHING LEVEL SETS

The present application claims the benefit of provisional U.S. patent Application Ser. No. 62/982,039, filed Feb. 26, 2020. The disclosures of the foregoing application are incorporated herein by reference.

FIELD OF THE INVENTION

The invention relates generally to image processing and automated metrology, and specifically to deep-learning based image processing of and metrology on charged particle based micrographs using fast marching level sets.

BACKGROUND OF THE INVENTION

Processing of electron microscopy acquired images is difficult due to the typical image quality, which can have poor contrast and poor signal to noise ratio. Such poor image quality may make using the image for structure analysis, such as metrology of structures in the image, difficult due to lack of definition of structure boundaries, for example. While various image processing techniques may be used to overcome some of the difficulty, these techniques typically require manual control by a highly skilled technician. In most use cases, automation and efficient analysis is desired.

SUMMARY

Apparatuses and methods for metrology on devices using fast marching level sets are disclosed herein. An example method at least includes initiating a fast marching level set seed on an image, propagating a fast marching level set curve from the fast marching level set seed to locate boundaries of a plurality of regions of interest within the image, and performing metrology on the regions of interest based in part on the boundaries.

An example method at least includes an electron microscope to acquire an image of a sample, the sample including a plurality of regions of interest, a core, coupled to or included in the electron microscope. The core includes code or is coupled to code that, when executed by the core, causes the core to initiate a fast marching level set seed within the image, propagate a fast marching level set curve from the fast marching level set seed to locate boundaries of each of the plurality of regions of interest within the image, and perform metrology on the regions of interest based in part on the boundaries.

BRIEF DESCRIPTION OF THE DRAWINGS

FIG. 7 shows two images having multiple layers located using a fast marching level set in accordance with an embodiment of the present disclosure.

FIG. 8 includes example images of different shapes that display the implementation of the techniques disclosed herein on non-circular ROIs.

FIG. 10 is an example functional block diagram in accordance with an embodiment of the present disclosure.

Like reference numerals refer to corresponding parts throughout the several views of the drawings.

DETAILED DESCRIPTION OF EMBODIMENTS

Figure 1:
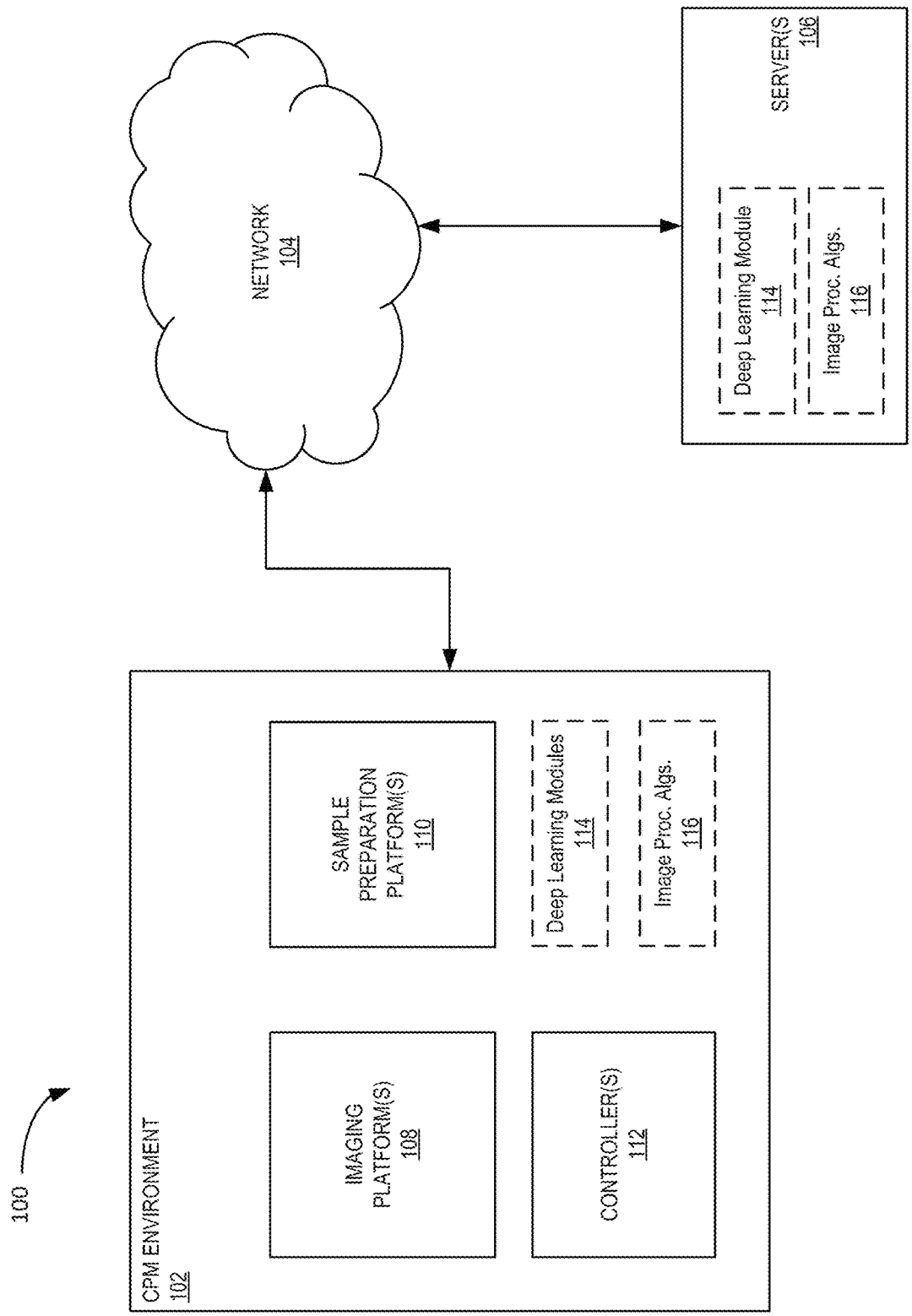
FIG. 1 is an example of a charged particle microscope system in accordance with an embodiment of the present disclosure.

Embodiments of the present invention are described below in the context of electron microscope executing segmentation and metrology techniques using a mix of conventional and deep-learning based algorithms and models. For example, an electron image may be smoothed and filtered using a trained model, which then has one or more fast marching level set algorithms administered to it to find one or more boundaries within the image. The delineated boundaries are then used to anchor metrology algorithms to measure various aspects of ROIs in the image. The various embodiments disclosed herein provide examples of implementing the disclosed techniques and should be not considered limiting to the disclosed techniques.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Accurate segmentation and metrology of regions of interest in electron microscopy micrographs can be difficult due to various undesirable image characteristics, such as low contrast and low signal to noise ratio (SNR). Additionally, the resolution at which the image was acquired may also affect the image quality. For example, segmentation of 3D-NAND memory structures and material interfaces associated with those structures is the basis of reliable metrology for 3D-NAND memory fabrication. To solve the metrology issues for 3D-NAND, device makers are experimenting with a number of technologies. At present, however, there is no fully automated solution for the measurement of critical dimensions (CDs) in 3D-NAND data collected using electron microscopy. Conventionally, a recipe builder included with a given electron microscope, whether a scanning electron microscope, transmission electron microscope or scanning transmission electron microscope, is generally used to build a measurement process to identify possible edges within a region of interest (ROI). In most scenarios, however, only a small area of the ROI is used due to the manual nature of the work. Building a recipe to find edges (e.g., pixels associated with the edges) of boundaries assumes good contrast between different materials, consistency in image quality within and across the images and the user's ability to place the edge finders at appropriate locations. Fitting a geometric shape assumes that each material layer has strictly adhered to geometric shapes during fabrication and there is enough contrast between materials. In both cases, human interaction is necessary. These methods and the measurement limitations associated with them reduce the effectiveness for accurate automatic detection of multiple CDs that is essential for automated monitoring of process variations. It should be noted that while much of the discussion and explanation herein uses 3D-NANDs as an example, the techniques disclosed herein are not so limited and any object or ROI within an image, even optical images, are capable of being analyzed by the disclosed techniques.

One solution to the above-described segmentation and metrology problem is to use fast marching level sets (FMLSs), which may be optionally assisted by machine learning based image preprocessing, to efficiently delineate boundaries within an ROI. For example, the various boundaries within a 3D-NAND via may be identified and numerous measurements made thereof using the disclosed techniques. The optional preprocessing may use deep-learning algorithms to enhance at least SNR and contrast of an image so that a smooth image is formed. With or without the preprocessing, a FMLS is initialized and allowed to optimize at (e.g., locate or identify) boundaries within or around the ROI. In some instances, a large number of boundaries may be located within a single image using only a single initialized FMLS curve or spot. Further, this technique works with single or multiple initializations that propagate towards region/object boundaries independent of topological merger and splitting. In some instances, additional evolution of the FMLS curve at the boundary is allowed to further optimize the curve to the boundary location. Once the boundary is identified and the FMLS curve is optimized, then deep learning based metrology may be performed to measure various aspects of the ROI, such as area, shape factor, eccentricity, solidity, convexity, best fit elliptical features, total area within the enclosed boundary, features of the pixel gray scale clusters within the enclosed object regions, boundary length, etc. Each stage of the boundary delineation and metrology may be performed automatically without the assistance of a user.

The disclosed solution provides an automated technique for descriptive metrology of ROIs, such as 3D-NAND memory cells for example. This technique overcomes some of the limitations of the edge-finder based methods, and can work on low contrast images and delineate the interface between different material layers constituting desired ROIs. This technique further allows descriptive measurements of shape features of each material layer, spatial distribution of the material thickness, etc., which can be a huge advantage for statistical analysis of variation in the structures. The technique may further open-up additional unsupervised machine learning models to pick outliers, implicit biases and fabrication constraints in manufacturing processes.

FIG. 1 is an example of a charged particle microscope system 100 in accordance with an embodiment of the present disclosure. The charged particle microscope (CPM) system 100, or simply system 100, at least includes a CPM environment 102, a network 104, one or more servers 106, and an artificial neural network 114. The CPM system 100 may be used to investigate and analyze samples of various size and makeup. For one example, the CPM system 100 may be implemented, at least partially, at an integrated circuit manufacturing site and used to analyze and measure various aspects of wafers and circuits fabricated at the site. In some embodiments, the CPM system 100 may be distributed across various locations. For example, the CPM environment 102 may be located at a fabrication or development location, the network 104 distributed locally, regionally, or nationally, and the server 106 located at a server farm and coupled to the CPM environment 100 via the network 104. Regardless of the organization of the CPM system 100, the system 100 may at least be used to implement one or more deep learning modules 114 along with one or more analytical algorithms to perform various other image processing tasks, such as image processing algorithms 116.

The CPM environment 102 includes any type of charged particle microscope, but the application of the neural network and analytics disclosed herein is not limited to charged particle microscopy, which is used for illustrative purposes only. Example CPMs include scanning electron microscopes (SEMs), transmission electron microscopes (TEMs), scanning transmission electron microscopes (STEMs), focused ion beams (FIBs), and dual beam (DB) systems that include both electron and ion beam capabilities, to name a few. The CPM environment 102 may be used to obtain electron or ion images of samples, some of which may be thin sections, e.g., lamellae, taken from a larger sample or wafer. The CPM environment 102 may include various aspects that can be contained in a single tool or that may be situated in separate tools. For example, the CPM environment 102 may include an imaging platform 108, e.g., an SEM, a TEM, or an STEM, a sample preparation platform 110, and one or more controllers 112. Of course, each platform 108 and 110 may include more than one microscope/sample preparation tool as well.

The imaging platform 108 is used to obtain images of samples, some of the samples may have been prepared by the sample prep platform 110, but that is not necessary. The images are obtained using an electron and/or ion source to irradiate the sample with a respective beam of charged particles. In some examples, the charged particle beam imaging is obtained by a scanned beam, e.g., moved across the sample, while in other examples the charged particle beam is not scanned. Backscattered, secondary, or transmitted electrons, for example, are then detected and gray scale images formed based thereon. The images include gray scale contrast depending on the materials of the sample, where the changes in gray scale indicate changes in the material type or crystal orientation. The imaging platform 108 may be controlled by internal controls (not shown), controller 112, or a combination thereof.

The sample prep platform 110 forms some of the samples that are imaged by the imaging platform 108. Of course, imaged samples may also be formed by other tools (not shown). The sample prep 110 may, for example, be a DB system that uses a FIB to prepare and assist in the removal of a thin sample from a larger sample, such as by ion milling, ion induced etching, or a combination thereof, and other techniques to process the sample for imaging. Other techniques may include, but are not limited to, planarizing mills/etches, fiducial generation, cross-section formation, top-down lamella preparation, delayering, and etc. The sample prep platform 110 may also include an electron imaging component that allows the sample prep process to be monitored, but the electron imaging component is not required. In some embodiments, the sample prep platform 110 may include other physical preparation aspects—lasers, cutting tools, resin encapsulation tools, cryogenic tools, etc.—that are used to prepare the sample for the imaging platform 108. The sample prep platform 110 may be controlled by internal controls (not shown), controller 112, or a combination thereof.

The network 104 may be any kind of network for transmitting signals between the CPM environment 102 and the server(s) 106. For example, the network 104 may be a local area network, a large area network, or a distributive network, such as the internet, a telephony backbone, and combinations thereof.

The servers 106 may include one or more computing platforms, virtual and/or physical, that can run code for various algorithms, deep learning/neural networks, and analytical suites. While not shown, a user of the CPM environment 102 may have access to the servers 106 for retrieval of data, updating software code, performing analytical tasks on data, etc., where the access is through the network 104 from the user's local computing environment (not shown). In some embodiments, the user accesses and/or retrieves image data stored on the servers 106, implements segmentation and/or metrology using the deep learning modules 114 and image processing algorithms 116 (which may be executed on the servers 106 or the CPM Environment 102), and performs segmentation and/or metrology at their local computing environment.

In operation, one or more images of a sample are obtained by the imaging platform 108. At least one of the images, which includes one or more structures of interest for example, may be segmented, e.g. boundaries located, by a combination of modules 114 and 116. The segmented image may then be used to locate/identify desired features of each, or at least one, of the imaged structures in the one or more acquired images. Initially, the image may be preprocessed using deep learning modules 114, for example, to improve the intensity gradient of the image, which will assist with segmentation. As such, the image is preprocessed to at least smooth the image so that noise is reduced and object boundaries are enhanced. The preprocessing of the image is optional in some embodiments, and is not necessary for implementing further processes, such as FMLS seeding and evolution. Using the smoothed image, a FMLS is performed by image processing algorithm module 116, which seeds an initial point or curve on the smoothed image, and propagates the seed to locate one or more boundaries. The propagation uses strong gradient magnitudes of intensity within the image to move and is slowed or stopped in locations where the gradient is low. These locations are typically where boundaries reside between different layers in the image.

In some embodiments, additional optimization of the propagated/evolved curve may be performed to improve the accuracy of the evolved contour. In such embodiments, a level set algorithm or an active contour, e.g., snakes, algorithm may be applied. This optimization allows for more accurate metrology, which is subsequently performed.

For the metrology, the deep learning module 114 is used to measure various aspects of the now segmented image. In some embodiments, an unsupervised machine learning process is used to perform the metrology. Any number of machine learning techniques may be used, such as Bayesian-learning, classification trees, random forest, neural networks, K-nearest neighbors (KNN), etc. to classify and measure the segmented features in the image.

While the image provided to the deep learning modules 114 is described as being obtained by imaging platform 108, in other embodiments, the image may be provided by a different imaging platform and provided to the ANN 114 via the network 104.

Figure 2:
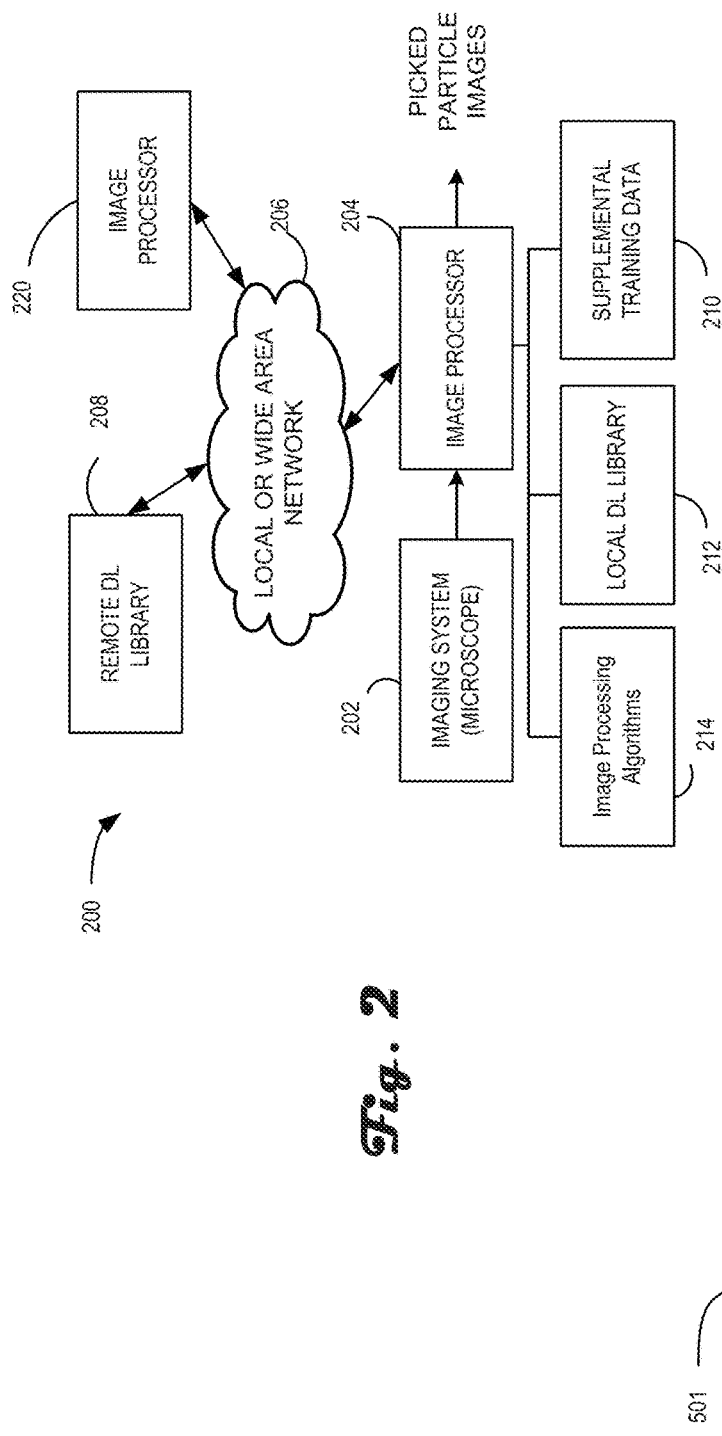
FIG. 2 is a representative system for segmenting and measuring ROIs in images along with other applications in accordance with an embodiment of the present disclosure.

FIG. 2 is a representative system 200 for segmenting and measuring ROIs in images in accordance with an embodiment of the present disclosure. System 200 at least includes an imaging system 202, such as an SEM, an STEM, or a TEM, that provides images of one or more ROIs to an image processor 204 for segmentation and measurement. A TEM or other electron microscope generally includes an electron beam source, electron optics, and an electron detection system that captures or produces an electron beam based image. As noted, segmentation of images acquired with an electron beam system, such as system 202, can be challenging due to the generally limited quality of images produced by the imaging system 202. The image processor 204 can be implemented in a processor associated with the imaging system 202 or with a separate local processing device as discussed, or with a remote processor coupled to the imaging system 202 via a local or wide area network 206. As shown in FIG. 2, a local deep learning (DL) library 212 is stored in a computer readable medium that is coupled to the image processor 204 and contains processor-executable instructions and storage of values that define one or more deep learning modules. In addition, computer readable media 210, 214 are provided for storage of supplemental training data for one or more of the deep learning modules stored in the DL library 212, and image processing algorithms 214, respectively. A single memory or storage device can be used for all of these, and some or all can be stored remotely and available via the network 206. For example, a remote DL library 208 and a remote image processor 220 are in communication with the image processor 204 via the network 206. The image processor 204 can also be located remotely with respect to imaging system 202. In some examples, remote DL library specifications are transferred to local storage such as the local DL library 212.

In operation, system 200 obtains an image with imaging system 202 and provides the image to image processor 204 or 220. The image may have one or more object features that are desired to be measured. In turn, image processor 204 (or image processor 220) may access a deep learning based image filter from either the remote DL library 208 or the local DL library 212 for preprocessing of the image. For example, the image processor 208 may access a deep learning based non-linear reaction-diffusion filter to reduce any noise in the image and enhance the contrast. The noise and contrast enhanced image provides a suitable image for seed evolution of the FMLS. This preprocessed image provides sharp intensity gradients between different material layers and a smooth uniform background, and may also be used as an output image of an input/output image pair for deep neural network training. In other embodiments, image processor 204 or 220 may access conventional reaction diffusion filters from image processing algorithms 214 to reduce noise and enhance the object features in the image. While either traditional or machine learning filters may be used, the machine learning filters provides faster preprocessing (not counting any training time). It should be noted, however, that preprocessing of the image is optional and may only be implemented when image quality is such that boundaries between different layers in the image are not pronounced enough for FMLS evolution.

Once the image is preprocessed, the image may be segmented to delineate areas of the object features for metrology purposes. In some embodiments, the segmentation process may be completed in two steps, for example, which include initiating the FMLS to propagate an initial seed to mark actual shapes of the object features, before initiating a classical level set method to improve the accuracy of the segmentation. In other embodiments, only one step may be used, which is the initiation of the FMLS to propagate an initial seed to mark actual shapes of the object features. Regardless of implementation, the FMLS curve propagates in a normal direction at every point in the curve, see FIG. 4 for an example. In some embodiments, an image intensity gradient function may be used as the speed function, which provides a simple behavior of slowing the motion of the curve as it approaches high intensity gradients (e.g., high force) and speeding up the curve propagation in low intensity gradient regions (e.g., low force areas, or uniform areas).

To start the fast marching process, as noted, an initial seed or an enclosed curve is provided on the image. In some embodiments, the image border pixels are used for initiating a curve around the entire image, which may then propagate inwards in a normal direction. The evolution of the FMLS curve may terminate when changes in the curve shape is negligible over successive time steps. Such negligible changes may indicate that no additional evolution is possible given the speed function. See FIG. 4 for examples. Lastly, the evolved curve may be considered an initial curve for evolution using classical level sets if the two step process is implemented.

Once the curve is fully evolved, either by the one or two step process, the curve becomes the basis for metrology. However, prior to metrology, artifacts in the image may be classified and eliminated using machine learning processes. For example, and with respect to circular objects of interest, a linear shape feature classifier based on support vector machines may be sued to classify the segmented objects into 3D-NAND class and artifact class. The segmented image is the image with the evolved FMLS curves that locate at least an outer boundary of the objects in the image. For simplicity, objects used for classification may be the same objects required to be measured for metrological analysis. The metrology may determine many characteristics of the objects in the image, such as shape factor, eccentricity, solidity, convexity, best fit elliptical features, total area within the enclosed boundary, features of the pixel gray scale clusters within the enclosed object regions, boundary length, etc. The only unconventional feature measured here is the gray scale cluster properties of the pixels within the enclosing boundary of the objects.

The metrology may be performed using machine learning based modules stored in remote DL library 208 and/or local DL library 212. The system 200 may implement one of any number of machine learning techniques may be used, such as Bayesian-learning, classification trees, random forest, neural networks, K-nearest neighbors (KNN), etc. to classify and measure the segmented features in the image. Once the metrology has been performed, the one ore more objects, e.g., ROIs, in the image may be characterized by a number of measurements. Such measurements include one or more of area, shape factor, eccentricity, solidity, convexity, best fit elliptical features, total area within the enclosed boundary, features of the pixel gray scale clusters within the enclosed object regions, boundary length, etc.

Figure 3:
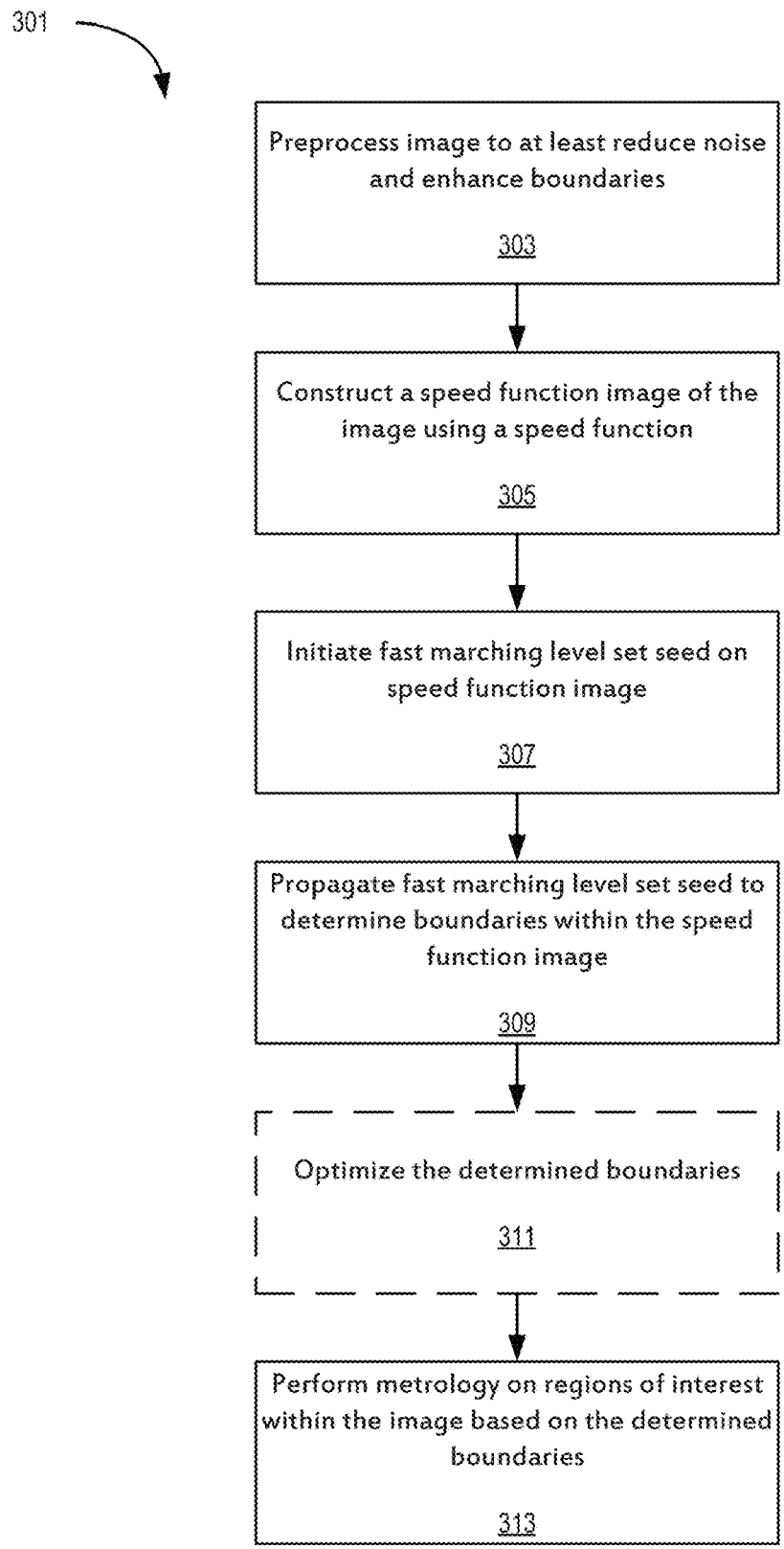
FIG. 3 is an example method for segmenting an image and performing metrology on one or more ROIs therein in accordance with an embodiment of the present disclosure.

FIG. 3 is an example method 301 for segmenting an image and performing metrology on one or more ROIs therein in accordance with an embodiment of the present disclosure. The method 301 may be performed on system 100 or 200, for example. In general, method 301 is performed using a mix of deep learning based modules and standard image processing algorithms to efficiently and accurately delineate boundaries and provide metrology of the features contained within the delineated boundaries.

Method 301 may begin at optional process block 303, which includes preprocessing an image to at least reduce noise and enhance boundaries. For the preprocessing, a deep-learning based trainable nonlinear reaction-diffusion filter or other type of trainable filter may be used to enhance the image. The preprocessed image then provides a smooth noise free surface for seed/curve evolution for the FMLS.

Process block 303 may, if implemented, be followed by process block 305, which includes constructing a speed function of the image using a speed function. In other embodiments, method 301 may begin at process block 305. The speed function can be computed as $$F(x) = e^{\wedge}(-k|\nabla I(x)|) \tag{1}$$

where I(x) is the image intensity at point x, $\nabla I(x)$ is the image intensity gradient and k is the curvature value at point x. This speed function provides a simple behavior of slowing the motion of the seeded/initialized curve as it approaches high image intensity gradient and speeding up the curve propagation in uniform areas (low intensity gradient regions). The speed function image may then be used for seeding a FMLS contour and evolving the contour to settle/locate/delineate boundaries within the image.

Process block 305 may be followed by process block 307, which includes initiating a fast marching level set seed on the speed function image. The seed may be a closed contour around an edge of the image, such as at the perimeter pixels of the image, or as one or more points within the image.

Process block 307 may be followed by process block 309, which includes propagating the fast marching level set seed to determine boundaries within the speed function image.

The propagation, e.g., evolution, of the seed, when the seed is a closed contour, propagates inward in a normal direction of the seed contour. The evolution of the curve may be terminated when changes in the curve shape is negligible over successive time steps, indicating no more evolution is possible under the given speed function, see FIG. 4 for an example.

Process block 309 may be followed by process block 311, which includes optimizing the determined boundaries, e.g., the evolved curve. Process block 311 is optional as noted by the dashed outline. In some examples, the evolved curve is considered as an initial curve, which may be optimized using standard level set or other active contour algorithms. Since the fast marching level set brings the initial contour very close to the desired shape, only a few iterations of standard level set optimization may be required before terminating the process. See FIG. 5 for an example, which shows the result of level set optimization with final fast marching result as the initial contour.

Process block 309 or 311 may be followed by process block 313, which includes performing metrology on ROIs within the image based on the determined boundaries. The metrology may be performed using a simple K-means clustering (unsupervised machine learning) process with a number of clusters as the input parameter. Size of the clusters, e.g., number of pixels in each cluster, distance of the cluster center from the object center, may be used as features in a larger object/artifact classification process of the metrology process. In some embodiments and with regards to 3D-NAND ROIs, gray scale analysis using unsupervised machine learning may be useful in eliminating artifacts that have similar size and shape as that of 3D-NAND ROIs, but are differentiated by the distribution of the pixel gray scales within the structure. A small number of 3D-NAND structures may be used to measure various features and construct a training model for larger object recognition goals using support vector machines, for example. Any of the many machine learning techniques such as Bayesian-learning, classification trees, random forest, neural networks, K-nearest neighbors (KNN), etc., to classify the shapes into 3D-NAND ROIs and artifacts may be used.

Figure 4:
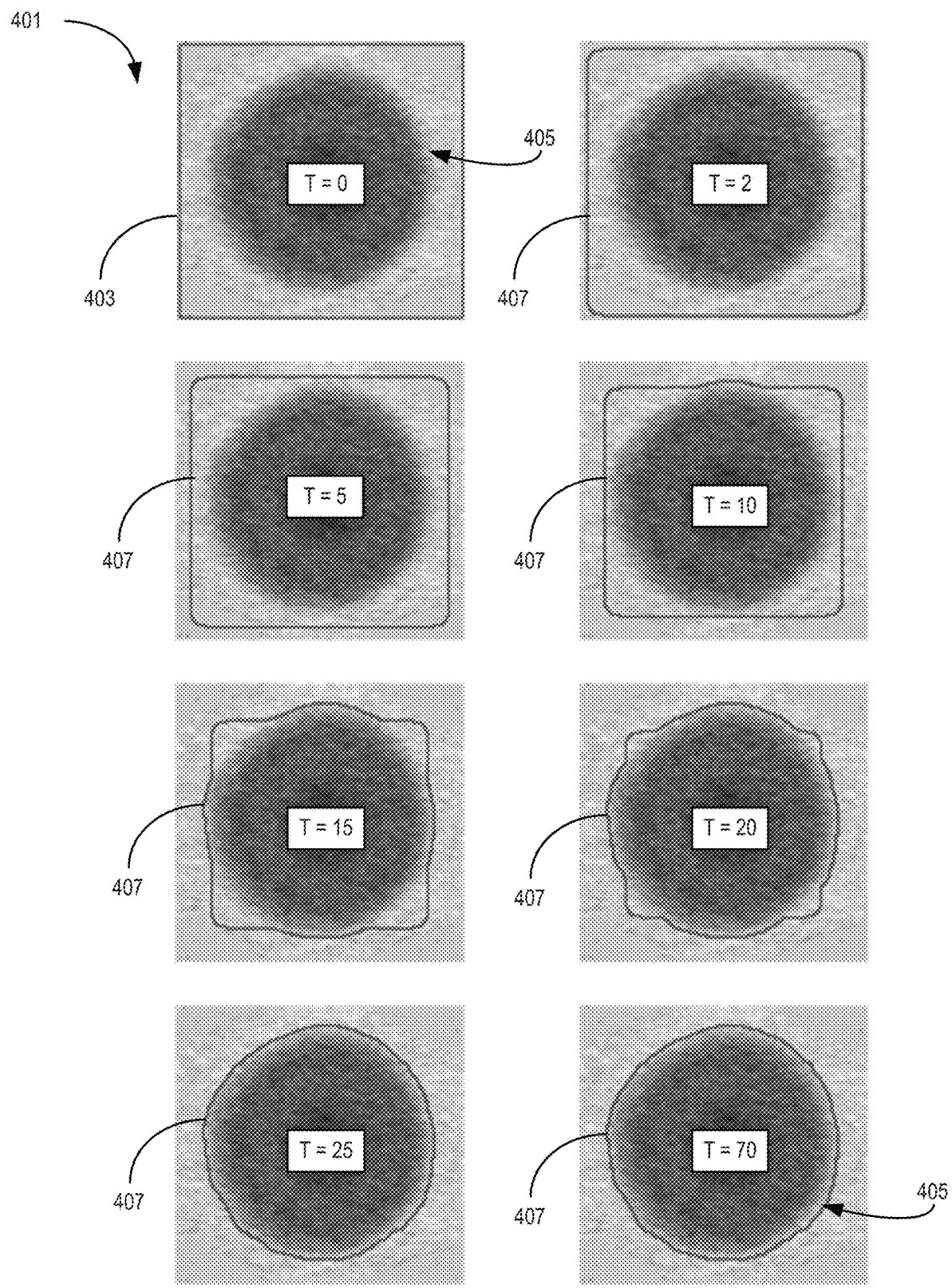
FIG. 4 is an example image sequence showing the initialization and propagation of a fast marching level set contour in accordance with an embodiment of the present disclosure.

FIG. 4 is an example image sequence 401 showing the initialization and propagation of a fast marching level set contour in accordance with an embodiment of the present disclosure. The image sequence 401 is an example of image processing performed by systems 100 and/or 200 and may be a result of at least part of method 301, for example. In general, image sequence 401 shows the initialization and optimization of a fast marching level set toward a single ROI. The result, as shown in image labeled t=30 is the settling of a contour 403 on a boundary 405 of the ROI.

The image labeled T=0 shows the seeding of a single contour 403. The contour is seeded on the outmost perimeter pixels of the image. While the seed is shown as a closed contour, the seed may also be one or more pixels located in respective individual pixels. Either seed strategy would result in optimization to the same boundary 405.

The images labeled T=2 through T=30 show the progression of the fast marching level set contour 407, where the number of the label indicates the time the fast marching level set algorithm has been executing to find the boundary. As can be seen, only 30 iterations of the fast marching level set algorithm was required to optimize to the boundary 405. By determining where the boundary 405 is located, the ROI shown in the images is segmented from the surrounding image. The optimized contour, which may be further refined in some embodiments, may be the basis for metrology of the ROI, such as determining a diameter, circumference, shape factor, eccentricity, solidity, convexity, best fit elliptical features, total area within the enclosed boundary, features of the pixel gray scale clusters within the enclosed object regions, boundary length, and etc.

Figure 5:
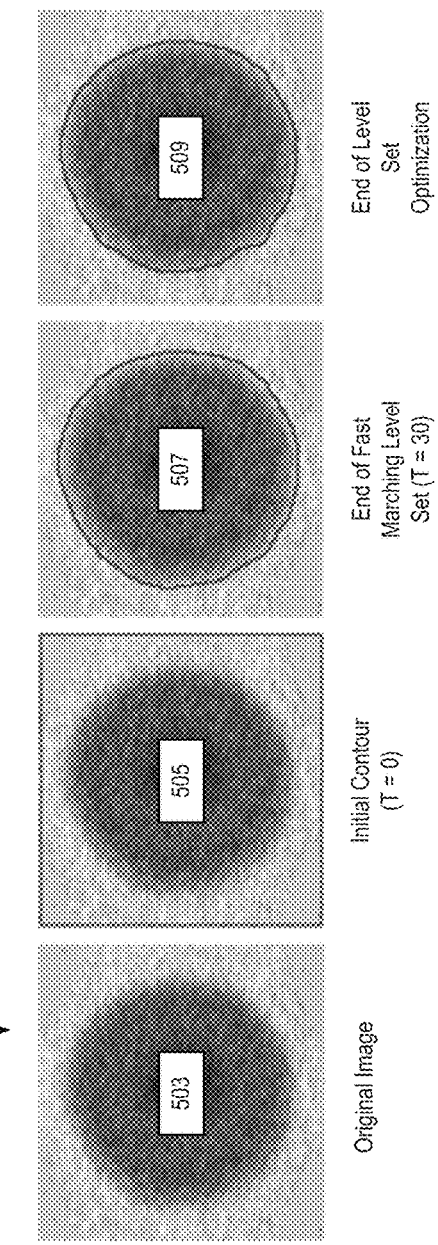
FIG. 5 is another example image sequence showing a high level illustration of images being processed using a disclosed method in accordance with an embodiment of the present disclosure.

FIG. 5 is another example image sequence 501 showing a high level illustration of images being processed using method 301 in accordance with an embodiment of the present disclosure. Image 503 is an example of an original image of a single 3D-NAND via, and image 505 is the original image after going through process block 305, e.g., speed function applied, and process block 307, e.g., initialization of the FMLS contour. The initialized contour is located at the edge pixels of the image. Subsequent process block 309, the contour has evolved to locate the outside boundary of the ROI, which took a time of 30 (arbitrary units). In this example, process block 311 is also performed to optimize the boundary contour. In such an example, the below level set equation was implemented:

$$\frac{\partial \varphi}{\partial t} = g(I)\|\nabla \varphi\| div\left(\frac{\nabla \varphi}{\|\nabla \varphi\|}\right) + g(I)\|\nabla \varphi\| \cdot v + \nabla g(I) \cdot \nabla \varphi \quad (2)$$

Where first term $\{g(I)\|\nabla\varphi\| div(\nabla\varphi/\|\nabla\varphi\|)\}$ is the smoothing term, it moves the curve into the direction of its curvature. The second term $\{g(I)\|\nabla\varphi\|\cdot v\}$ is the balloon term, controlling the speed of the curve propagation with parameter v. Lastly, the third term $\{\nabla g(I)\cdot\nabla\varphi\}$ is the image attachment term that helps the curve to converge. In many respects, at this point, level sets belong to the same class as active contours with a smoothing term controlled by the curvature of the contour and the image attachment term being the external force that attracts the contour towards image intensity gradient peaks. Alternatively, a "snakes" method may be used instead to improve the accuracy instead of level sets formulation as in equation (2). In case of high resolution TEM images where a number of material layers and their approximate thicknesses are known a priori, after detecting an outer boundary using FMLS, a snake algorithm can be used to delineate internal structures, see FIG. 7 for example.

Figure 6:
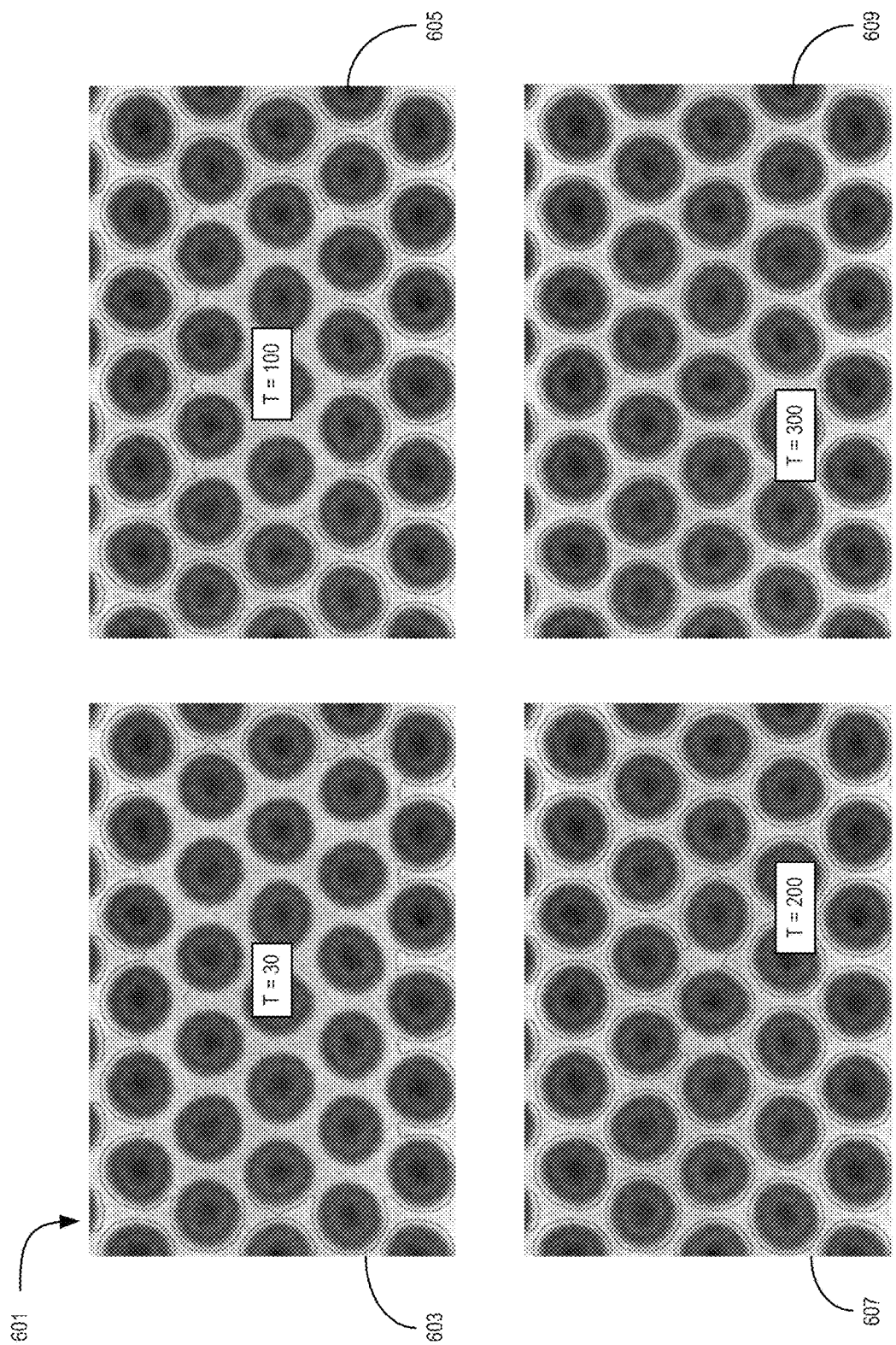
FIG. 6 is another example image sequence showing the optimization of a fast marching level set around a plurality of ROIs in accordance with an embodiment of the present disclosure.

FIG. 6 is another example image sequence 601 showing the optimization of a fast marching level set around a plurality of ROIs in accordance with an embodiment of the present disclosure. All of the images in image sequence 601 are the same, but show the progression of a fast marching level set contour as it optimizes at boundaries around all ROIs within the image. The image sequence 601 is an example of image processing performed by systems 100 and/or 200 and may be a result of at least part of method 301, for example. In general, when multiple objects are present, FMLS algorithms have an inherent ability to change the propagating contour according to the topology, break and merge as they evolve, and are further capable of formation of sharp corners, cusps, etc. The images in sequence 601 shows application of FMLS on a larger image with multiple 3D-NAND memory cells and demonstrates the ability of the propagating/evolving contour to break and merge according to the topology and delineate a boundary of all the individual ROIs.

Image 603 shows the progression of a seed contour at time equals 30, where the contour is starting to move around at perimeter of ROIs. In image 605, which is at time equals 200, the contours have found a boundary around the perimeter ROIs and the progression of the seed has begun to mover around ROIs just inside the perimeter ROIs. Images 607 and 609 show respective times of 200 and 300 and how the contour continues to progress and find boundaries around additional ROIs within the image. At time equal 300, the boundaries of all ROIs within the image have been located. It should be noted that the fast marching level set contour is capable of breaking off when it connects with itself around a boundary but is still capable of continuing propagation until all boundaries have been located.

FIG. 7 shows two images having multiple layers located using a fast marching level set in accordance with an embodiment of the present disclosure. In some embodiments, such as when high resolution images are processed, the fast marching level set and the metrology may be able to identify individual materials/layers within an ROI. For example, individual layers within a 3D-NAND structure may be identified and measured. By marking/locating interfaces between adjacent layers/materials and measuring features such as average layer thickness, variation in layer thickness in the radial direction, and the like, characterization of all or most layers in an ROI is possible. Of course, the resolution of the image will determine the number of layers identifiable and measurable. For instance, high resolution STEM or TEM images may provide detail not identifiable in a low resolution SEM image.

To illustrate, image 701 is a high resolution SEM image that allowed for identification and location of not only the outer boundary of a plurality of ROIs, but also two internal boundaries within each of the ROIs. Image 703 is a TEM image of a single ROI where the techniques disclosed herein have been used to locate seven boundaries. In some embodiments, the images 701 and 703 have had the optimized fast marching level sets optimized using active contours algorithms, such as a snakes algorithm.

In some embodiments, different algorithms and approaches may be used to delineate the different boundaries around and in an ROI. For example, in high resolution images, the metrology requirement is to identify individual materials within the 3D-NAND structure by marking their interfaces with neighboring materials and measuring the features such as average thickness of the layer, variation in the layer thickness in the radial direction, etc. By making multiple such measurements, any consistent variation detrimental to the performance of the 3D-NAND cell can be identified. In a high-resolution SEM data, for example, and with a priori information about the number of material layers and their approximate thickness from the design specification, multiple contours can be initialized and allowed to evolve using the FMLS techniques disclosed herein. Results of such initialization to mark multiple interfaces inside the memory cell acquired using SEM imaging mode is shown in image 701.

After marking the outer boundary of the 3D-NAND memory cell as accurately as possible, one can initialize multiple contours inside at appropriate distances from the outer boundary using the a priori information about the number of interfaces to be detected and their approximate distances (in terms of thickness of the material) from the outer boundary. Image 703 illustrates this process for delineating multiple material interfaces within a 3D-NAND memory cell, where the high resolution image was acquired using S/TEM mode, for example.

FIG. 8 includes example images of different shapes that display the implementation of the techniques disclosed herein on non-circular ROIs. While 3D-NAND structures have been used as a main example herein, the disclosed technique need not be confined to such structures. Images 801, 803 and 805 displays the application of level sets to segmentation and subsequent metrology of fins and other structures. For example, image 801 is one type of fin structure having a boundary as marked using the techniques disclosed herein. For another example, images 903 and 805 show another type of fin structure with outer boundary marked (803), and with inner boundary marked (805).

Figure 9A:
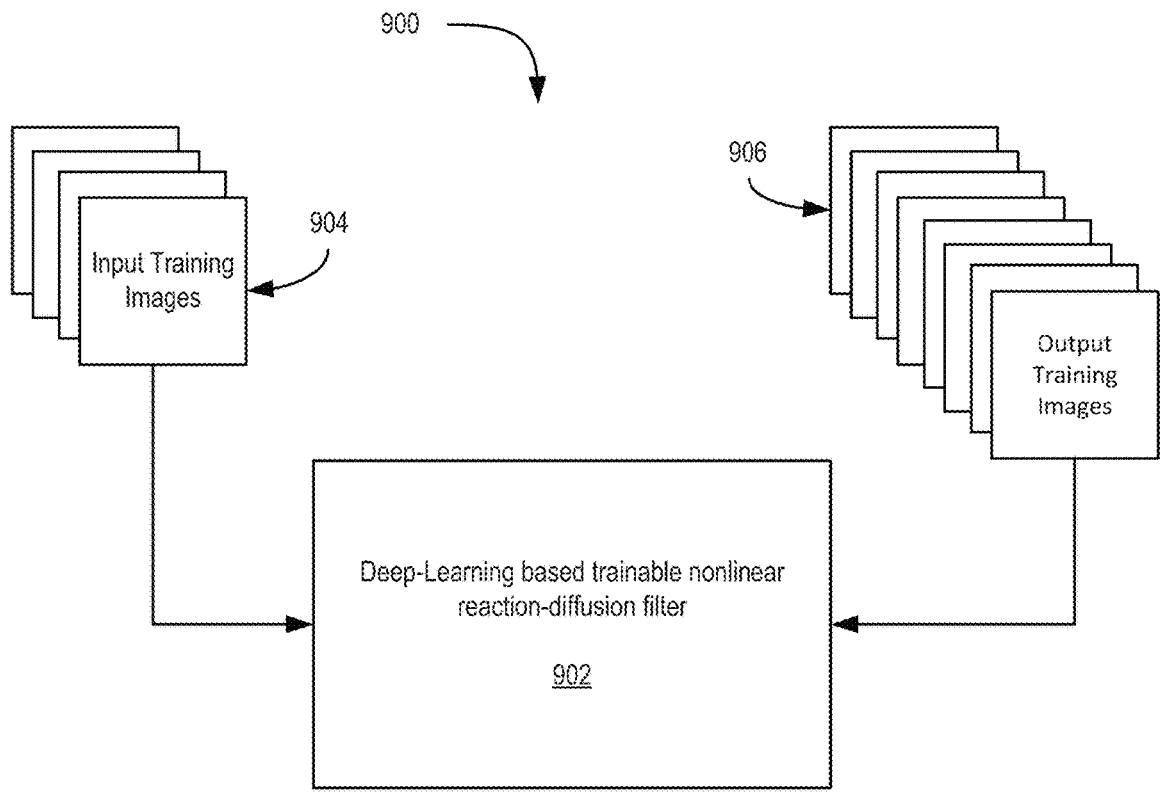
FIG. 9A is an example deep learning filter used for preprocessing images in accordance with a disclosed embodiment.

FIG. 9A is an example deep learning filter 900 used for preprocessing images in accordance with a disclosed embodiment. To be specific, FIG. 9A discloses a technique for training a deep-learning based trainable nonlinear reaction-diffusion filter 902 using associated input and output pairs. The training may be performed by systems 100 or 200, or by another system then the trained model ported into one of the systems 100 or 200.

Figure 9B:
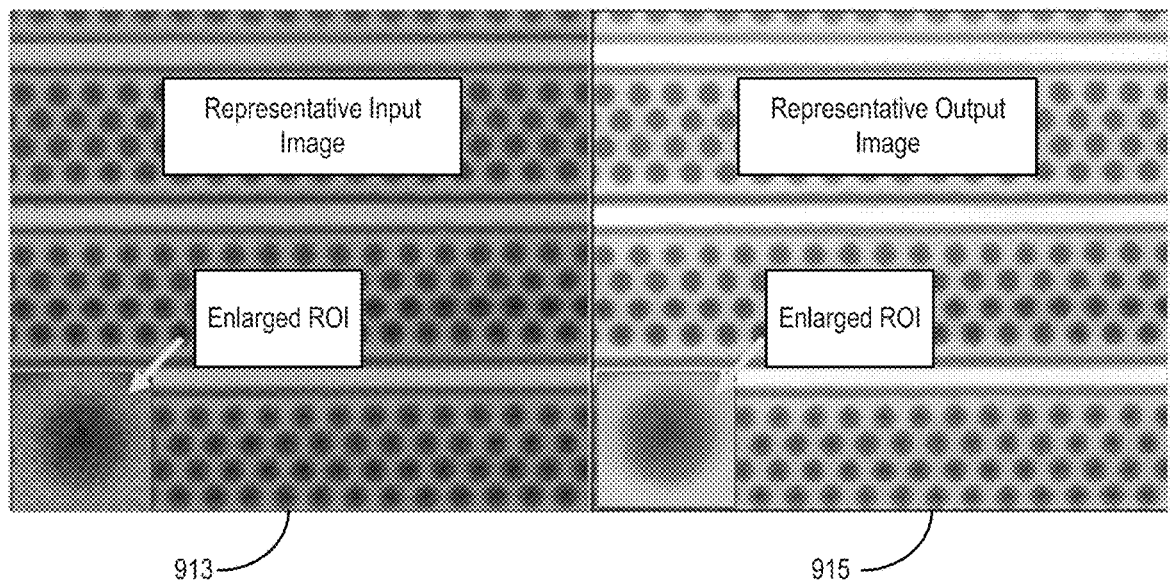
FIG. 9B illustrates an example result of reconstructing output image of the input/output image pair for deep model training.

For model training filter 902, input/output pairs are prepared from a small number of frames/images. For example, images were collected with 32 image frames (which upon drift correction and averaging forms a final single image) and a selective pixel integration is used to correct possible drift and reduce noise. The resulting image is brightness corrected, contrast stretched and pre-processed using reaction-diffusion filters to improve the signal to noise ratio (SNR). This preprocessed image is characterized by sharp intensity gradient between different material layers and a smooth uniform background, see image 915 of FIG. 9B for an example. This preprocessed image acts as an output image 906 of the input/output image pair for deep neural network training. FIG. 9B illustrates an example result of reconstructing output image of the input/output image pair for deep model training. Images reconstructed with just 8 frames act as input images 904, see image 913 for an example, for the input/output image pair for training the deep model filter 902. By bootstrapping sampling of 8 frames from 32 frames, multiple input/output pairs may be built for each 32-frame set acquired for training the deep learning model 902.

FIG. 10 is an example functional block diagram 1000 in accordance with an embodiment of the present disclosure. FIG. 10 is a block diagram that illustrates a computer system 1000 that an embodiment of the invention may include. The computing system 1000 may be an example of computing hardware included with system 100 and/or 200. Computer system 1000 at least includes a bus 1040 or other communication mechanism for communicating information, and a hardware processor 1042 coupled with bus 1040 for processing information. Hardware processor 1042 may be, for example, a general purpose microprocessor. The computing system 1000 may be used to implement the methods and techniques disclosed herein, such as methods 301 and 401, and may also be used to obtain images and segment said images with one or more classes.

Computer system 1000 also includes a main memory 1044, such as a random access memory (RAM) or other dynamic storage device, coupled to bus 1040 for storing information and instructions to be executed by processor 1042. Main memory 1044 also may be used for storing temporary variables or other intermediate information during execution of instructions to be executed by processor 1042. Such instructions, when stored in non-transitory storage media accessible to processor 1042, render computer system 1000 into a special-purpose machine that is customized to perform the operations specified in the instructions.

Computer system 1000 further includes a read only memory (ROM) 1046 or other static storage device coupled to bus 1040 for storing static information and instructions for processor 1042. A storage device 1048, such as a magnetic disk or optical disk, is provided and coupled to bus 1040 for storing information and instructions.

Computer system 1000 may be coupled via bus 1040 to a display 1050, such as a cathode ray tube (CRT), for displaying information to a computer user. An input device 1052, including alphanumeric and other keys, is coupled to bus 1040 for communicating information and command selections to processor 1042. Another type of user input device is cursor control 1054, such as a mouse, a trackball, or cursor direction keys for communicating direction information and command selections to processor 1042 and for controlling cursor movement on display 1050. This input device typically has two degrees of freedom in two axes, a first axis (e.g., x) and a second axis (e.g., y), that allows the device to specify positions in a plane.

Computer system 1000 may implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor 1042 executing one or more sequences of one or more instructions contained in main memory 1044. Such instructions may be read into main memory 1044 from another storage medium, such as storage device 1048. Execution of the sequences of instructions contained in main memory 1044 causes processor 1042 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1048. Volatile media includes dynamic memory, such as main memory 1044. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 1040. Transmission media can also take the form of acoustic or light waves, such as those generated during radio-wave and infra-red data communications.

Various forms of media may be involved in carrying one or more sequences of one or more instructions to processor 1042 for execution. For example, the instructions may initially be carried on a magnetic disk or solid state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1040. Bus 1040 carries the data to main memory 1044, from which processor 1042 retrieves and executes the instructions. The instructions received by main memory 1044 may optionally be stored on storage device 1048 either before or after execution by processor 1042.

Computer system 1000 also includes a communication interface 1056 coupled to bus 1040. Communication interface 1056 provides a two-way data communication coupling to a network link 1058 that is connected to a local network 1060. For example, communication interface 1056 may be an integrated services digital network (ISDN) card, cable modem, satellite modem, or a modem to provide a data communication connection to a corresponding type of telephone line. As another example, communication interface 1056 may be a local area network (LAN) card to provide a data communication connection to a compatible LAN. Wireless links may also be implemented. In any such implementation, communication interface 1056 sends and receives electrical, electromagnetic or optical signals that carry digital data streams representing various types of information.

Network link 1058 typically provides data communication through one or more networks to other data devices. For example, network link 1058 may provide a connection through local network 1060 to a host computer 1062 or to data equipment operated by an Internet Service Provider (ISP) 1064. ISP 1064 in turn provides data communication services through the world wide packet data communication network now commonly referred to as the "Internet" 1066. Local network 1060 and Internet 1066 both use electrical, electromagnetic or optical signals that carry digital data streams. The signals through the various networks and the signals on network link 1058 and through communication interface 1056, which carry the digital data to and from computer system 1000, are example forms of transmission media.

Computer system 1000 can send messages and receive data, including program code, through the network(s), network link 1058 and communication interface 1056. In the Internet example, a server 1068 might transmit a requested code for an application program through Internet 1066, ISP 1064, local network 1060 and communication interface 1056.

The received code may be executed by processor 1042 as it is received, and/or stored in storage device 1048, or other non-volatile storage for later execution.

The embodiments discussed herein to illustrate the disclosed techniques should not be considered limiting and only provide examples of implementation. For example, an x-ray shield as disclosed herein could include three elongate members formed in a y-shape, or could have more than four members. The different numbers of members, for example, may affect the degree of twist to achieve a desired amount of x-ray shielding, with, in general, less twist needed for additional numbers of elongate members. Those skilled in the art will understand the other myriad ways of how the disclosed techniques may be implemented, which are contemplated herein and are within the bounds of the disclosure.

What is claimed is:
1. A method comprising:
   initiating a fast marching level set seed on an image;
   propagating a fast marching level set curve from the fast marching level set seed to locate boundaries of a plurality of regions of interest within the image; and
   performing metrology on the regions of interest based in part on the boundaries, wherein initiating the fast marching level set seed on the image includes initiating an enclosed seed curve located around a perimeter of the image.

2. The method of claim 1, wherein initiating the fast marching level set seed on the image includes initiating one or more seed points within the image.

3. The method of claim 1, wherein propagating the fast marching level set curve from the fast marching level set seed to locate boundaries of the plurality of regions of interest within the image includes:
constructing a speed function image of the image based on a speed function algorithm; and
propagating the fast marching level set seed to determine the boundaries of the plurality of regions of interest within the speed function image.

4. The method of claim 1, further comprising;
preprocessing the image, wherein preprocessing the image includes:
improving signal to noise ratio of the image;
correcting brightness;
enhancing contrast; and
enhancing object boundaries.

5. The method of claim 4, wherein the preprocessing is performed using a deep-learning based model, and wherein the deep-learning based model is a trainable nonlinear reaction-diffusion filter.

6. The method of claim 4, wherein the preprocessed image includes sharp intensity gradient between different material layers and a smooth uniform background.

7. The method of claim 1, further including:
optimizing the boundaries of the plurality of regions of interest based on active contours or level set algorithms.

8. The method of claim 1, wherein the metrology is performed using a machine learning based model to determine measurements of one or more regions of interest of the plurality of regions of interest.

9. A system comprising:
an electron microscope to acquire an image of a sample, the sample including a plurality of regions of interest;
a core, coupled to or included in the electron microscope, including code or coupled to code that, when executed by the core, causes the core to:
initiate a fast marching level set seed within the image;
propagate a fast marching level set curve from the fast marching level set seed to locate boundaries of each of the plurality of regions of interest within the image;
optimize the boundaries of the plurality of regions of interest located via the propagated fast marching level set curve based on active contours or level set algorithms; and
perform metrology on the regions of interest based in part on the boundaries as optimized.

10. The system of claim 9, wherein the code that, when executed by the core, causes the core to initiate the fast marching level set seed within the image further includes code that, when executed by the core, causes the core to initiate one or more seed points within the image.

11. The system of claim 9, wherein the code that, when executed by the core, causes the core to initiate the fast marching level set seed within the image further includes code that, when executed by the core, causes the core to initiate an enclosed seed curve within the image.

12. The system of claim 11, wherein the enclosed curve is located around a perimeter of the image.

13. The system of claim 9, wherein the code that, when executed by the core, causes the core to propagate the fast marching level set curve from the fast marching level set seed to locate boundaries of the plurality of regions of interest within the image further includes code that, when executed by the core, causes the core to:
construct a speed function image of the image based on a speed function algorithm; and
propagate the fast marching level set seed to determine the boundaries of the plurality of regions of interest within the speed function image.

14. The system of claim 9, wherein the code further includes code that, when executed by the core, causes the core to preprocess the image, wherein preprocessing the image includes one of:
improve signal to noise ratio of the image;
correct brightness;
enhance contrast; and
enhance object boundaries.

15. The system of claim 14, wherein the core implements a deep-learning based model to preprocess the image.

16. The system of claim 15, wherein the deep-learning based model is a nonlinear reaction-diffusion filter.

17. The system of claim 9, wherein the core implements a machine learning based model to perform the metrology.

18. The system of claim 17, wherein the machine learning based model is one of a Bayesian-learning based model, classification tree based model, random forest based model, neural network based model and K-nearest neighbors based model.

19. A method comprising:
initiating a fast marching level set seed on an image;
propagating a fast marching level set curve from the fast marching level set seed to locate boundaries of a plurality of regions of interest within the image; and
performing metrology on the regions of interest based in part on the boundaries,
wherein propagating the fast marching level set curve from the fast marching level set seed to locate boundaries of the plurality of regions of interest within the image includes:
constructing a speed function image of the image based on a speed function algorithm; and
propagating the fast marching level set seed to determine the boundaries of the plurality of regions of interest within the speed function image.

20. A system comprising:
an electron microscope to acquire an image of a sample, the sample including a plurality of regions of interest;
a core, coupled to or included in the electron microscope, including code or coupled to code that, when executed by the core, causes the core to:
initiate a fast marching level set seed within the image;
propagate a fast marching level set curve from the fast marching level set seed to locate boundaries of each of the plurality of regions of interest within the image; and
perform metrology on the regions of interest based in part on the boundaries,
wherein the code that, when executed by the core, causes the core to propagate the fast marching level set curve from the fast marching level set seed to locate boundaries of the plurality of regions of interest within the image further includes code that, when executed by the core, causes the core to:
construct a speed function image of the image based on a speed function algorithm; and propagate the fast marching level set seed to determine the boundaries of the plurality of regions of interest within the speed function image.

21. A method comprising:
preprocessing an image, wherein preprocessing the image includes:
   improving signal to noise ratio of the image;
   correcting brightness;
   enhancing contrast; and
   enhancing object boundaries;
initiating a fast marching level set seed on the image as preprocessed;
propagating a fast marching level set curve from the fast marching level set seed to locate boundaries of a plurality of regions of interest within the image; and
performing metrology on the regions of interest based in part on the boundaries.

22. The method of claim 21, wherein the preprocessing is performed using a deep-learning based model, and wherein the deep-learning based model is a trainable nonlinear reaction-diffusion filter.

23. The method of claim 21, wherein the preprocessed image includes sharp intensity gradient between different material layers and a smooth uniform background.

24. A system comprising:
an electron microscope to acquire an image of a sample, the sample including a plurality of regions of interest;
a core, coupled to or included in the electron microscope, including code or coupled to code that, when executed by the core, causes the core to:
   preprocess the image, wherein preprocessing the image includes one of:
      improve signal to noise ratio of the image,
      correct brightness,
      enhance contrast, and
      enhance object boundaries;
   initiate a fast marching level set seed within the image;
   propagate a fast marching level set curve from the fast marching level set seed to locate boundaries of each of the plurality of regions of interest within the image; and
   perform metrology on the regions of interest based in part on the boundaries.

25. The system of claim 24, wherein the core implements a deep-learning based model to preprocess the image.

26. The system of claim 24, wherein the deep-learning based model is a nonlinear reaction-diffusion filter.

* * * * *